(12) United States Patent
Rahman et al.

(10) Patent No.: US 11,699,408 B2
(45) Date of Patent: Jul. 11, 2023

(54) PERFORMING ASYNCHRONOUS MEMORY CLOCK CHANGES ON MULTI-DISPLAY SYSTEMS

(71) Applicant: ATI Technologies ULC, Markham (CA)

(72) Inventors: Arshad Rahman, Markham (CA); Rajeevan Panchacharamoorthy, Markham (CA); Boris Ivanovic, Markham (CA)

(73) Assignee: ATI Technologies ULC, Markham (CA)

( * ) Notice: Subject to any disclaimer, the term of this patent is extended or adjusted under 35 U.S.C. 154(b) by 0 days.

(21) Appl. No.: 17/131,209

(22) Filed: Dec. 22, 2020

(65) Prior Publication Data

US 2022/0199047 A1 Jun. 23, 2022

(51) Int. Cl.
G09G 3/36 (2006.01)
G09G 5/00 (2006.01)
G11C 7/22 (2006.01)
G11C 7/10 (2006.01)

(52) U.S. Cl.
CPC ........... *G09G 3/3618* (2013.01); *G09G 5/001* (2013.01); *G09G 5/006* (2013.01); *G11C 7/1072* (2013.01); *G11C 7/222* (2013.01)

(58) Field of Classification Search
CPC ...... G09G 3/3618; G09G 5/001; G09G 5/006; G11C 7/222; G11C 7/1072
See application file for complete search history.

(56) References Cited

U.S. PATENT DOCUMENTS

| 5,335,010 A | 8/1994 | Lindemeier et al. |
| 5,818,543 A | 10/1998 | Lee |
| 5,860,056 A | 1/1999 | Pond |

(Continued)

FOREIGN PATENT DOCUMENTS

| WO | 2009156366 A1 | 12/2009 |
| WO | 2011087905 A1 | 7/2011 |

OTHER PUBLICATIONS

Non-Final Office Action in U.S. Appl. No. 15/686,934, dated Jan. 25, 2019, 8 pages.

(Continued)

*Primary Examiner* — Sahlu Okebato
(74) *Attorney, Agent, or Firm* — Kowert Hood Munyon Rankin and Goetzel PC; Rory D. Rankin

(57) ABSTRACT

Systems, apparatuses, and methods for performing asynchronous memory clock changes on multiple displays are disclosed. From time to time, a memory clock frequency change is desired for a memory subsystem storing frame buffer(s) used to drive pixels to multiple displays. For example, when the real-time memory bandwidth demand differs from the memory bandwidth available with the existing memory clock frequency, a control unit tracks the vertical blanking interval (VBI) timing of a first display. Also, the control unit causes a second display to enter into panel self-refresh (PSR) mode. Once the PSR mode of the second display overlaps with a VBI of the first display, a memory clock frequency change, including memory training, is initiated. After the memory clock frequency change, the displays are driven by the frame buffer(s) in the memory subsystem at an updated frequency.

20 Claims, 8 Drawing Sheets

(56) References Cited

U.S. PATENT DOCUMENTS

| | | |
|---|---|---|
| 6,414,960 B1 | 7/2002 | Kuhn et al. |
| 7,479,981 B2 | 1/2009 | Tierney et al. |
| 7,596,359 B2 | 9/2009 | Kimoto et al. |
| 7,715,634 B2 | 5/2010 | Lei et al. |
| 7,881,258 B2 | 2/2011 | Gilbert et al. |
| 8,300,563 B2 | 10/2012 | Krishnaswamy et al. |
| 8,365,238 B2 | 1/2013 | Reznic et al. |
| 8,422,961 B2 | 4/2013 | Katie |
| 8,457,026 B1 | 6/2013 | Ho et al. |
| 8,976,220 B2 | 3/2015 | Maxwell |
| 9,450,620 B1 | 9/2016 | Ahmed et al. |
| 9,716,537 B2 | 7/2017 | Mammoser et al. |
| 9,786,985 B2 | 10/2017 | Kim et al. |
| 9,799,954 B2 | 10/2017 | Preradovic et al. |
| 9,948,413 B1 | 4/2018 | Zhou et al. |
| 10,312,980 B2 | 6/2019 | Maamari et al. |
| 10,523,295 B2 | 12/2019 | Kasher et al. |
| 10,582,458 B2 | 3/2020 | Sadek et al. |
| 10,680,927 B2 | 6/2020 | Vu |
| 10,871,559 B2 | 12/2020 | Vu et al. |
| 10,959,111 B2 | 3/2021 | Stark, Jr. et al. |
| 11,140,368 B2 | 10/2021 | Vu et al. |
| 2002/0196366 A1 | 12/2002 | Cahill, III |
| 2003/0072376 A1 | 4/2003 | Krishnamachari et al. |
| 2004/0075621 A1* | 4/2004 | Shiuan .................. G06F 3/1431 345/1.1 |
| 2004/0081238 A1 | 4/2004 | Parhy |
| 2004/0196919 A1 | 10/2004 | Mehta et al. |
| 2004/0204103 A1 | 10/2004 | Rouphael |
| 2005/0185097 A1 | 8/2005 | Takatori et al. |
| 2006/0017843 A1 | 1/2006 | Shi et al. |
| 2006/0026450 A1* | 2/2006 | Bounitch .................. G09G 5/18 713/600 |
| 2006/0209890 A1 | 9/2006 | MacMullan et al. |
| 2006/0209892 A1 | 9/2006 | MacMullan et al. |
| 2006/0212911 A1 | 9/2006 | MacMullan et al. |
| 2006/0262985 A1 | 11/2006 | Chen et al. |
| 2007/0147492 A1 | 6/2007 | Marquant et al. |
| 2007/0223380 A1 | 9/2007 | Gilbert et al. |
| 2008/0030509 A1 | 2/2008 | Conroy et al. |
| 2008/0064425 A1 | 3/2008 | Kim et al. |
| 2008/0088635 A1 | 4/2008 | Callway et al. |
| 2008/0144713 A1 | 6/2008 | Kimmich et al. |
| 2009/0150943 A1 | 6/2009 | Vasudevan et al. |
| 2009/0213940 A1 | 8/2009 | Steinbach et al. |
| 2010/0009635 A1 | 1/2010 | Qin et al. |
| 2010/0150252 A1 | 6/2010 | Camp, Jr. et al. |
| 2010/0214169 A1 | 8/2010 | Katie |
| 2011/0058104 A1 | 3/2011 | Arai |
| 2011/0070928 A1 | 3/2011 | Hsu et al. |
| 2011/0129025 A1 | 6/2011 | Jaeckel et al. |
| 2011/0151790 A1 | 6/2011 | Khandekar et al. |
| 2011/0286545 A1 | 11/2011 | Guignard et al. |
| 2012/0276896 A1 | 11/2012 | Ren et al. |
| 2012/0327115 A1 | 12/2012 | Chhetri et al. |
| 2013/0115887 A1 | 5/2013 | Kwon et al. |
| 2013/0194950 A1 | 8/2013 | Haghighat et al. |
| 2013/0242117 A1 | 9/2013 | Luo et al. |
| 2014/0010319 A1 | 1/2014 | Baik et al. |
| 2014/0126620 A1 | 5/2014 | Maltsev et al. |
| 2014/0184625 A1* | 7/2014 | Shah .................. G06T 1/60 345/530 |
| 2014/0266900 A1 | 9/2014 | Kasher |
| 2014/0269937 A1 | 9/2014 | Wadsworth et al. |
| 2014/0368667 A1 | 12/2014 | Peterson et al. |
| 2015/0110167 A1 | 4/2015 | Chen et al. |
| 2015/0289147 A1 | 10/2015 | Lou et al. |
| 2015/0333994 A1 | 11/2015 | Gell et al. |
| 2015/0341646 A1 | 11/2015 | Sze et al. |
| 2016/0105229 A1 | 4/2016 | Trainin et al. |
| 2016/0134485 A1 | 5/2016 | Thapliya et al. |
| 2016/0149633 A1 | 5/2016 | Sanderovich et al. |
| 2016/0227229 A1 | 8/2016 | Wadsworth |
| 2016/0227432 A1 | 8/2016 | Freeman et al. |
| 2016/0267881 A1 | 9/2016 | Tann et al. |
| 2016/0301770 A1 | 10/2016 | Marra et al. |
| 2016/0337150 A1 | 11/2016 | Larsson et al. |
| 2017/0026263 A1 | 1/2017 | Gell et al. |
| 2017/0127408 A1 | 5/2017 | Du |
| 2017/0134076 A1 | 5/2017 | Maamari et al. |
| 2017/0141885 A1 | 5/2017 | Bontu et al. |
| 2017/0156067 A1 | 6/2017 | Huang |
| 2017/0187437 A1 | 6/2017 | Cariou et al. |
| 2017/0207839 A1 | 7/2017 | Eitan et al. |
| 2017/0222704 A1 | 8/2017 | Eitan et al. |
| 2017/0251484 A1 | 8/2017 | Negus et al. |
| 2017/0264350 A1 | 9/2017 | Sanderovich et al. |
| 2018/0027420 A1 | 1/2018 | Takahashi et al. |
| 2018/0062719 A1 | 3/2018 | Verma et al. |
| 2018/0074188 A1 | 3/2018 | Polo et al. |
| 2018/0093177 A1 | 4/2018 | Tokubo |
| 2018/0123901 A1 | 5/2018 | Yermakov et al. |
| 2018/0137412 A1 | 5/2018 | Nikkhah et al. |
| 2018/0198506 A1 | 7/2018 | Sanderovich et al. |
| 2018/0199256 A1 | 7/2018 | Sanderovich et al. |
| 2018/0205423 A1 | 7/2018 | Sanderovich et al. |
| 2018/0227027 A1 | 8/2018 | Trainin et al. |
| 2018/0234860 A1 | 8/2018 | Kasher et al. |
| 2018/0248603 A1 | 8/2018 | Kasher et al. |
| 2018/0288635 A1 | 10/2018 | Kaushik et al. |
| 2019/0036572 A1 | 1/2019 | Kasher et al. |
| 2019/0068473 A1 | 2/2019 | Vu |
| 2019/0101638 A1 | 4/2019 | Vu et al. |
| 2019/0104276 A1 | 4/2019 | Vu et al. |
| 2019/0104458 A1 | 4/2019 | Svennebring et al. |
| 2019/0158156 A1 | 5/2019 | Da Silva et al. |
| 2019/0173544 A1 | 6/2019 | Vu et al. |
| 2019/0199467 A1 | 6/2019 | Vu |
| 2019/0215256 A1 | 7/2019 | Dhanabalan et al. |
| 2019/0230185 A1 | 7/2019 | Dhanabalan et al. |
| 2019/0261209 A1 | 8/2019 | Balasubramanian et al. |
| 2019/0364449 A1 | 11/2019 | Yang et al. |
| 2020/0280862 A1 | 9/2020 | Stark, Jr. et al. |

OTHER PUBLICATIONS

Non-Final Office Action in U.S. Appl. No. 15/832,448, dated Feb. 1, 2019, 15 pages.

International Search Report and Written Opinion in International Application No. PCT/US2018/052350, dated Dec. 14, 2018, 13 pages.

Van Der Schaar et al., "Robust Transmission of MPEG-4 Scalable Video Over 4G Wireless Networks", International Conference on Image Processing, Sep. 22, 2002, pp. 757-760, vol. 3, IEEE.

International Search Report and Written Opinion in International Application No. PCT/US2018/052373, dated Jan. 7, 2019, 13 pages.

Vu, Ngoc Vinh, U.S. Appl. No. 15/852,833, entitled "Video Codec Data Recovery Techniques for Lossy Wireless Links", filed Dec. 22, 2017, 36 pages.

Non-Final Office Action in U.S. Appl. No. 15/721,125, dated Feb. 20, 2019, 9 pages.

Non-Final Office Action in U.S. Appl. No. 15/852,833, dated May 31, 2019, 11 pages.

Final Office Action in U.S. Appl. No. 15/721,125, dated Sep. 10, 2019, 9 pages.

Final Office Action in U.S. Appl. No. 15/832,448, dated Sep. 30, 2019, 18 pages.

Final Office Action in U.S. Appl. No. 15/852,833, dated Oct. 3, 2019, 12 pages.

Final Office Action in U.S. Appl. No. 15/686,934, dated Oct. 16, 2019, 9 pages.

Non-Final Office Action in U.S. Appl. No. 15/721,125, dated Jan. 7, 2020, 10 pages.

Non-Final Office Action in U.S. Appl. No. 15/832,448, dated Apr. 15, 2020, 18 pages.

Non-Final Office Action in U.S. Appl. No. 15/852,833, dated Apr. 17, 2020, 12 pages.

Final Office Action in U.S. Appl. No. 15/832,448, dated Oct. 28, 2020, 19 pages.

(56) References Cited

OTHER PUBLICATIONS

Non-Final Office Action in U.S. Appl. No. 15/721,125, dated Mar. 11, 2021, 11 pages.
International Search Report and Written Opinion in International Application No. PCT/IB2021/061867, dated April 25, 2022, 9 pages.

* cited by examiner

PERFORMING ASYNCHRONOUS MEMORY CLOCK CHANGES ON MULTI-DISPLAY SYSTEMS

BACKGROUND

Description of the Related Art

Many types of computer systems include display devices to display images, video streams, and data. Accordingly, these systems typically include functionality for generating and/or manipulating images and video information. In digital imaging, the smallest item of information in an image is called a "picture element" and more generally referred to as a "pixel."

Some systems include multiple separate displays. In these systems, multiple-display technology enables a single graphics processing unit (GPU) (or other device such as an accelerated processing unit (APU) or other type of system on chip (SOC) or any application-specific integrated circuit (ASIC) with a display controller) to simultaneously support multiple independent display outputs. In one example, a computing system may independently connect multiple high-resolution displays into a large integrated display surface to provide an expanded visual workspace. Gaming, entertainment, medical, audio and video editing, business and other applications may take advantage of the expanded visual workspace and increase multitasking opportunities.

For each supported display, a video subsystem maintains a respective frame buffer that stores data, such as one or more video frames, which may be stored in dynamic random access memory (DRAM). For each supported display, a video controller reads data via a given one of one or more DRAM interfaces for access to a respective frame buffer. A memory clock is typically used to control a data rate for accessing the frame buffer within the DRAM. In some cases, in order to provide a physical connection for transmitting the pixel bitstream from the frame buffer to a display device, a computer is connected directly to the display device through an interface such as DisplayPort (DP), embedded DisplayPort (eDP), high-definition multimedia interface (HDMI), or other type of interface. In one implementation, the bandwidth limitations for the video stream sent from the computer to the display device would be the maximum bit rate of the DisplayPort, eDP, or HDMI cable.

In a scenario where multiple workloads (e.g., game rendering, video processing) are accessing the memory subsystem, the memory subsystem can be clocked at its maximum possible frequency to ensure the memory subsystem can process large numbers of reads and writes. In some cases, when the memory subsystem is not being overly stressed, the system may desire to reduce the memory clock frequency in order to reduce power consumption. Changing the memory clock frequency may require a training session to be performed on the memory interface, a configuration/mode change, or another action that requires access to be stopped temporarily. However, in multi-display systems, each display may have different timing properties associated with driving pixels to the display. This makes it difficult or impossible to find a sufficient duration of time to halt all memory access, without introducing visual artifacts on any of the displays, at times when the memory interface needs to be retrained or when other types of mode changes need to be performed. Therefore, in some systems the memory clock may be forced to remain at a maximum frequency or other predetermined frequency. Consequently, the power consumption for multiple displays may be significant. As power consumption increases for modern integrated circuits (ICs), more costly cooling systems such as larger fans, larger heat sinks and systems to control ambient temperature are utilized to remove excess heat and prevent IC failure. This may also result in louder acoustics and thus an unpleasant customer experience.

BRIEF DESCRIPTION OF THE DRAWINGS

The advantages of the methods and mechanisms described herein may be better understood by referring to the following description in conjunction with the accompanying drawings, in which.

DETAILED DESCRIPTION OF IMPLEMENTATIONS

Figure 1:
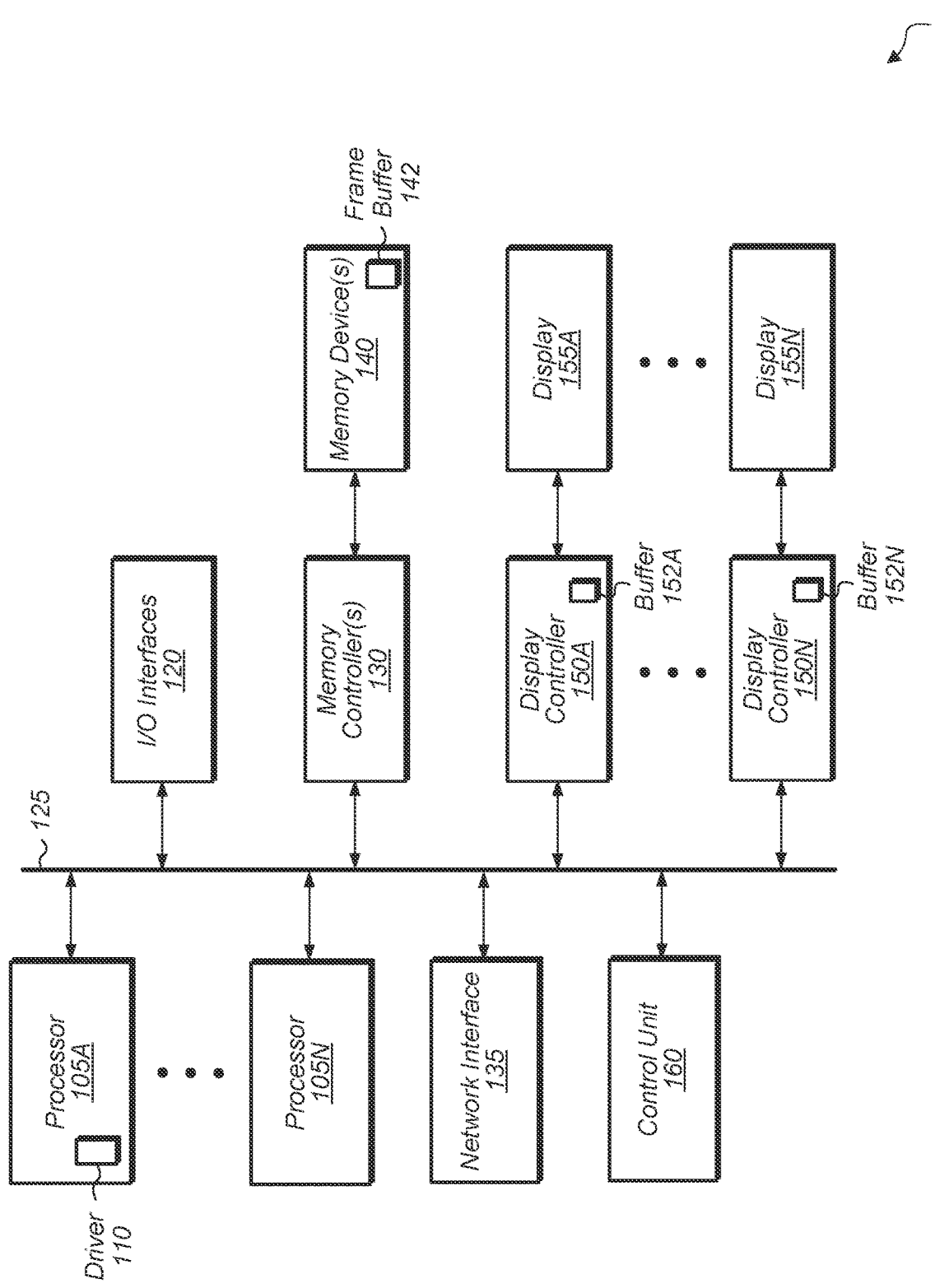
FIG. 1 is a block diagram of one implementation of a computing system.

In the following description, numerous specific details are set forth to provide a thorough understanding of the methods and mechanisms presented herein. However, one having ordinary skill in the art should recognize that the various implementations may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Systems, apparatuses, and methods for performing asynchronous memory clock changes on multiple displays are disclosed. In one implementation, a multi-display system drives multiple displays from frame buffer(s) in a memory subsystem. In one implementation, a control unit determines a memory bandwidth demand on the memory subsystem in real-time based on current operating conditions. Next, the control unit compares the real-time memory bandwidth demand or predicted memory bandwidth demand to a bandwidth available with an existing memory clock frequency setting. If the bandwidth available with the existing memory clock frequency setting differs from the real-time memory bandwidth demand or predicted demand, the control unit makes a decision to change the existing memory clock frequency setting to better match the real-time demand. In various implementations, the predicted memory bandwidth demand is generated based on a machine learning model, heuristic, or other technique.

When the control unit decides that a memory clock frequency change is desired for the memory subsystem, the control unit causes a first display to transition into panel self-refresh (PSR) mode. The transition into PSR mode can take some amount of time, such as one or more frames. As used herein, "PSR mode" is defined as when a display device (i.e., panel) uses its own memory to refresh what is visible on the screen instead of relying on an interface to provide a stream of pixels. Simultaneously with putting the first display into PSR mode, the control unit checks a second display to determine when the vertical blanking interval (VBI) shall occur. Once the PSR mode of the first display overlaps with the VBI of the second display, the memory clock frequency change is initiated. Also, many memory devices (e.g., graphics double data rate 6 (GDDR6) synchronous dynamic random-access memory (SDRAM) devices) require memory training when a memory clock frequency is changed. For these memory devices, memory training is performed as part of the memory clock frequency change. After the memory clock frequency change, the first display is transitioned out of PSR mode, which can take some amount of time to occur, and the displays are driven by the frame buffer(s) in the memory subsystem operating at an updated memory clock frequency.

Referring now to FIG. 1, a block diagram of one implementation of a computing system 100 is shown. In one implementation, computing system 100 includes at least processors 105A-N, input/output (I/O) interfaces 120, bus 125, memory controller(s) 130, network interface 135, memory device(s) 140, display controllers 150A-N, displays 155A-N, and control unit 160. In other implementations, computing system 100 includes other components and/or computing system 100 is arranged differently.

Display controllers 150A-N are representative of any number of display controllers which are included in system 100, with the number varying according to the implementation. Each display controller 150A-N drives a corresponding display 155A-N, with displays 155A-N representative of any number of displays. In some implementations, a single display controller of display controllers 150A-N drives multiple displays.

Display controller 150A includes buffer 152A for storing a frame to be displayed when display 155A is in panel self-refresh (PSR) mode. PSR mode is used when static content is being displayed, allowing display 155A to be driven from buffer 152A rather than being driven from frame buffer 142 of memory device 140. This helps to reduce the power consumption when screen content is not changing. For example, in a desktop computer setting, when a user is viewing a document or other static content, the screen pixels are not changing, and a frame can be stored in buffer 152A to be repeatedly driven to display 155A. In another example, in a mobile device setting, when the mobile device is showing the home screen, the screen contents are not changing, and so display 155A is driven from a frame stored in buffer 152A. Other examples of static screen content can be encountered in various other use cases.

Display controller 150N also includes buffer 152N for the same purpose when display 155N is in PSR mode. However, it is not necessary for all displays 155A-N to support PSR mode. Accordingly, in one implementation, system 100 includes one or more displays which support PSR mode and one or more displays which do not support PSR mode.

In one implementation, control unit 160 determines if condition(s) for performing a power-state change have been detected. Also, in this implementation, control unit 160 monitors the timing of vertical blanking intervals for displays 155A-N. As used herein, the term "vertical blanking interval" is defined as the time elapsing after the final visible line of a first frame is displayed but before the first visible line of a second frame is displayed, where the second frame is immediately subsequent to the first frame in the video sequence. Within a frame, there are active lines (i.e., scan lines) and vertical blanking lines. The number of active lines determines the active frame time and the number of vertical blanking lines determines the duration of the vertical blanking interval. In some cases, a vertical synchronization (or Vsync) pulse is generated at the start of the vertical blanking interval. In these cases, the vertical synchronization pulse serves as a marker of the occurrence of the vertical blanking interval.

When conditions for performing a power-state change are detected, control unit 160 determines when to implement the power-state change so that it coincides with a first display being in PSR mode simultaneously with a second display undergoing a vertical blanking interval. In one implementation, the power-state change involves adjusting the memory clock frequency of one or more memory devices 140. Control unit 160 can be implemented using any suitable combination of circuitry, memory elements, and program instructions. It is noted that control unit 160 can also be referred to by other names, such as a system management controller, system management unit, system controller, controller, and so on. While a single control unit 160 is shown in FIG. 1, it should be understood that this is merely representative of one implementation. In other implementations, system 100 can include multiple control units 160 located in any suitable locations. Also, in another implementation, control unit 160 is implemented by one of processor 105A-N.

Processors 105A-N are representative of any number of processors which are included in system 100. In one implementation, processor 105A is a general purpose processor, such as a central processing unit (CPU). In this implementation, processor 105A executes a driver 110 (e.g., graphics driver) for communicating with and/or controlling the operation of one or more of the other processors in system 100. It is noted that depending on the implementation, driver 110 can be implemented using any suitable combination of hardware, software, and/or firmware.

In one implementation, processor 105N is a data parallel processor with a highly parallel architecture. Data parallel processors include graphics processing units (GPUs), digital signal processors (DSPs), field programmable gate arrays (FPGAs), application specific integrated circuits (ASICs), and so forth. In some implementations, processors 105A-N include multiple data parallel processors. In one implementation, processor 105N is a GPU which renders pixel data into frame buffer 142 representing an image. This pixel data is then provided to display controllers 150A-N to be driven to displays 155A-N, respectively. In other implementations, pixel data is rendered into multiple frame buffers, with each frame buffer used to drive a separate display 155A-N.

Memory controller(s) 130 are representative of any number and type of memory controllers accessible by processors 105A-N. While memory controller(s) 130 are shown as being separate from processors 105A-N, it should be understood that this merely represents one possible implementation. In other implementations, a memory controller 130 can be embedded within one or more of processors 105A-N and/or a memory controller 130 can be located on the same semiconductor die as one or more of processors 105A-N. Memory controller(s) 130 are coupled to any number and type of memory devices(s) 140. Memory device(s) 140 are representative of any number and type of memory devices. For example, the type of memory in memory device(s) 140 includes Dynamic Random Access Memory (DRAM), Static Random Access Memory (SRAM), Graphics Double Data Rate 6 (GDDR6) Synchronous DRAM (SDRAM), NAND Flash memory, NOR flash memory, Ferroelectric Random Access Memory (FeRAM), or others.

I/O interfaces 120 are representative of any number and type of I/O interfaces (e.g., peripheral component interconnect (PCI) bus, PCI-Extended (PCI-X), PCIE (PCI Express) bus, gigabit Ethernet (GBE) bus, universal serial bus (USB)). Various types of peripheral devices (not shown) are coupled to I/O interfaces 120. Such peripheral devices include (but are not limited to) displays, keyboards, mice, printers, scanners, joysticks or other types of game controllers, media recording devices, external storage devices, network interface cards, and so forth. Network interface 135 is able to receive and send network messages across a network.

In various implementations, computing system 100 is a computer, laptop, mobile device, game console, server, streaming device, wearable device, or any of various other types of computing systems or devices. It is noted that the number of components of computing system 100 varies from implementation to implementation. For example, in other implementations, there are more or fewer of each component than the number shown in FIG. 1. It is also noted that in other implementations, computing system 100 includes other components (e.g., phase-locked loops, voltage regulators) not shown in FIG. 1 to avoid cluttering the figure. Additionally, in other implementations, computing system 100 is structured in other ways than shown in FIG. 1.

Figure 2:
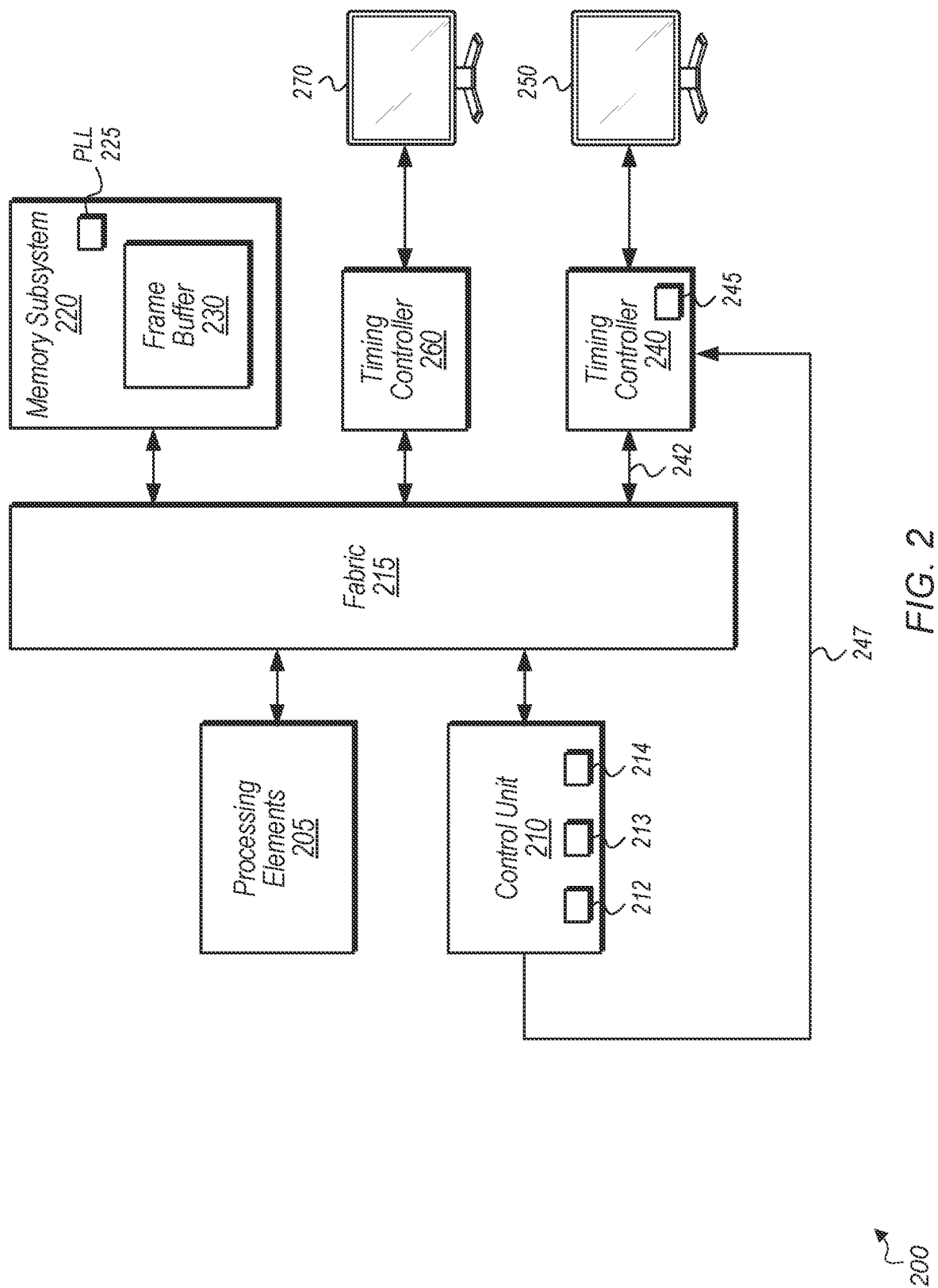
FIG. 2 is a block diagram of one implementation of a multi-display system.

Turning now to FIG. 2, a block diagram of one implementation of a multi-display system 200 is shown. In one implementation, system 200 includes processing elements 205, control unit 210, fabric 215, memory subsystem 220, timing controllers 240 and 260, and display devices 250 and 270. While timing controllers 240 and 260 are shown as being separate components from display devices 250 and 270, respectively, this does not preclude timing controllers 240 and 260 from being integrated within display devices 250 and 270, respectively. In other words, timing controllers 240 and 260 can be located internally or externally to display devices 250 and 270, respectively, depending on the implementation. Similarly, while buffer 245 is shown as being located within timing controller 240, this does not preclude buffer 245 from being located externally to timing controller 240 in other implementations. It is noted that a timing controller may be referred to as a "TCON" or "T-CON" for short. Generally speaking, a TCON receives video image and frame data from various sources, processes the data, and then sends the data out in a format that is compatible with its target display.

Processing elements 205 are representative of any number, type, and arrangement of processing resources (e.g., CPU, GPU, FPGA, ASIC). Control unit 210 includes any suitable combination of execution units, circuitry, memory, and program instructions. While control unit 210 is shown as a separate component from processing elements 205, this is representative of one particular implementation. In another implementation, the functionality of control unit 210 is performed, at least in part, by processing elements 205. Fabric 215 is representative of any number and type of buses, communication devices/interfaces, interconnects, and other interface modules for connecting the various components of system 200 together.

In one implementation, processing elements 205 generate pixel data for display on display devices 250 and 270. This pixel data is written to frame buffer 230 in memory 220 by processing elements 205 and then driven to display devices 250 and 270 from frame buffer 230 in one implementation. The pixel data stored in frame buffer 230 represents frames of a video sequence in one implementation. In another implementation, the pixel data stored in frame buffer 230 represents the screen content of a laptop or desktop personal computer (PC). In a further implementation, the pixel data stored in frame buffer 230 represents the screen content of a mobile device (e.g., smartphone, tablet).

Memory subsystem 220 includes any number and type of memory controllers and memory devices. In one implementation, memory subsystem 200 is capable of operating at various different clock frequencies which can be adjusted according to various operating conditions. However when a memory clock frequency change is implemented, memory training is typically performed to modify various parameters, adjust the characteristics of the signals generated for the transfer of data, and so on. For example, the phase, the delay, and/or the voltage level of various memory interface signals are tested and adjusted during memory training. Various signal transmissions may be conducted between a memory controller and memory in order to train these memory interface signals. Finding an appropriate time to perform this memory training when modifying a memory clock frequency can be challenging.

In one implementation, control unit 210 causes a memory clock frequency update to be performed when display device 250 is in PSR mode and when display device 270 has a vertical blanking interval. This allows the memory training to be performed without disrupting the driving of display data to display devices 250 and 270. During PSR mode, the pixel data is stored in buffer 245 of timing controller 240 and driven to display device 250 without involving memory subsystem 220. In other words, when operating in PSR mode, display device 250 performs a self-refresh using the pixel data stored in buffer 245. Also, when a vertical blanking interval (VBI) occurs for display device 270, no data is being transferred from frame buffer 230 to display device 270. This provides a window of opportunity for initiating a memory clock frequency change for memory subsystem 220.

In one implementation, control unit 210 includes memory bandwidth monitor 212, tracking unit 213, and frequency adjustment unit 214. Memory bandwidth monitor 212, tracking unit 213, and frequency adjustment unit 214 can be implemented using any combination of circuitry, execution units, and program instructions. Also, in another implementation, memory bandwidth monitor 212, tracking unit 213, and frequency adjustment unit 214 are individual units that are separate from control unit 210 rather than being part of control unit 210. In other implementations, control unit 210 can include other arrangements of components that perform similar functionality as memory bandwidth monitor 212, tracking unit 213, and frequency adjustment unit 214.

In one implementation, memory bandwidth monitor 212 compares real-time memory bandwidth demand of memory subsystem 220 to the memory bandwidth available with the existing memory clocks. If the memory bandwidth available with existing memory clocks differs from the real-time memory bandwidth demand by more than a threshold, then control unit 210 makes a decision to change the frequencies of one or more clocks of memory subsystem 220. When the decision to change the frequencies of one or more clocks of memory subsystem 220, tracking unit 213 causes display device 250 to go into PSR mode by sending a corresponding command to timing controller 240. It may take display device 250 several frames to get into PSR mode. The number of frames that it takes for display device 250 can vary according to the implementation. Tracking unit 213 also tracks the timing of VBIs for display device 270.

In one implementation, in order to expedite the transition from non-PSR mode to PSR mode, tracking unit 213 sends a signal to timing controller 240 over sideband interface 247 for timing controller 240 to scan out the previously stored frame. It is noted that sideband interface 247 is separate from the main interface 242 used for passing pixels to timing controller 240. In one implementation, the main interface 242 is an eDP interface. In other implementations, the main interface 242 is compatible with any of various other protocols. Sending the signal over sideband interface 247 allows the timing and scheduling of invoking a scan-out of the previously stored frame to occur in a relatively short period of time (i.e., a line time) before the VBI interval of display device 270. This is in contrast to the traditional method of sending a request over the main interface 242 which can result in a lag of several frames before timing controller 240 enters PSR mode.

Once timing controller 240 is in PSR mode, frequency adjustment unit 214 generates a command to program PLL 225 to generate the memory clock at a different frequency at a time when tracking unit 213 determines that there will be a VBI for display device 270. In other implementations, control unit 210 includes other arrangements of logic and/or units to cause an adjustment to be made to the memory clock frequency during the overlap of PSR mode and VBIs for display devices 250 and 270, respectively. For example, in another implementation, tracking unit 213 and frequency adjustment unit 214 are combined together into a single unit. In a further implementation, frequency adjustment unit 214 is split into multiple units, with a first unit generating a command to change the frequency generated by PLL 225 and a second unit sending the command to PLL 225. Other arrangements of circuitry, processing elements, execution units, interface units, program instructions, and other components for implementing the functionality of control unit 210 are possible and are contemplated.

The functionality of timing controllers (or TCONs) varies from TCON to TCON. Some TCONs only keep a fraction of the current picture. For these TCONs, for PSR to be functional, the TCON needs to enter a mode (i.e., "enable PSR") where the picture is copied to the TCON's memory each time a picture is scanned in. Then, when PSR is entered, the last historical picture is read out of the memory. Some TCONs, or specific modes of a TCON, always have the previous picture available. Going into PSR mode in this case does not require the enable PSR mode. Accordingly, entering PSR mode can involve two steps or one step depending on the capabilities or functionality of the TCON.

System 200 can be any of various types of computing systems. For example, in one implementation, system 200 includes a laptop connected to an external display. In this implementation, display device 250 is the internal display of the laptop while display device 270 is the external display. In another implementation, system 200 includes a mobile device connected to an external display. In this implementation, display device 250 is the internal display of the mobile device while display device 270 is the external display. Other scenarios employing the components of system 200 to implement the techniques described herein are possible and are contemplated.

In some implementations, a system can have three or more displays. For example, in one implementation, a system has multiple internal displays that are PSR capable. In this implementation, the second internal display can include similar logic to the first internal display and when one display is placed into PSR, the other would be placed into PSR as well. In another implementation, the system includes multiple external displays that are PSR capable. The system would query the external displays and determine their capabilities and how to trigger the PSR or "self-refresh" mode if applicable.

In one implementation, only a single non-"self-refresh capable display can be supported, as long as the other displays are "self-refresh capable", with the following exception: multiple non-self-refresh capable displays can be treated as a single display, if their vertical blanking intervals can be synchronized to occasionally be coincident. For example, two 60 Hz displays could be synchronized to have coincident clocks by "pulling" the timing (slightly) of one display, bit by bit, until it matches the other. Once synchronized, very small adjustments could occasionally be used to keep them in sync. This is a standard technique often known as "clock-pulling" or "genlocking". In another example, a 60 Hz and a 30 Hz display could have every second VBI (in terms of the 30 Hz display) in sync with similar technique. VBI intervals could differ between the displays, so the shorter and coincident interval would be applicable for training/clock change.

Figure 3:
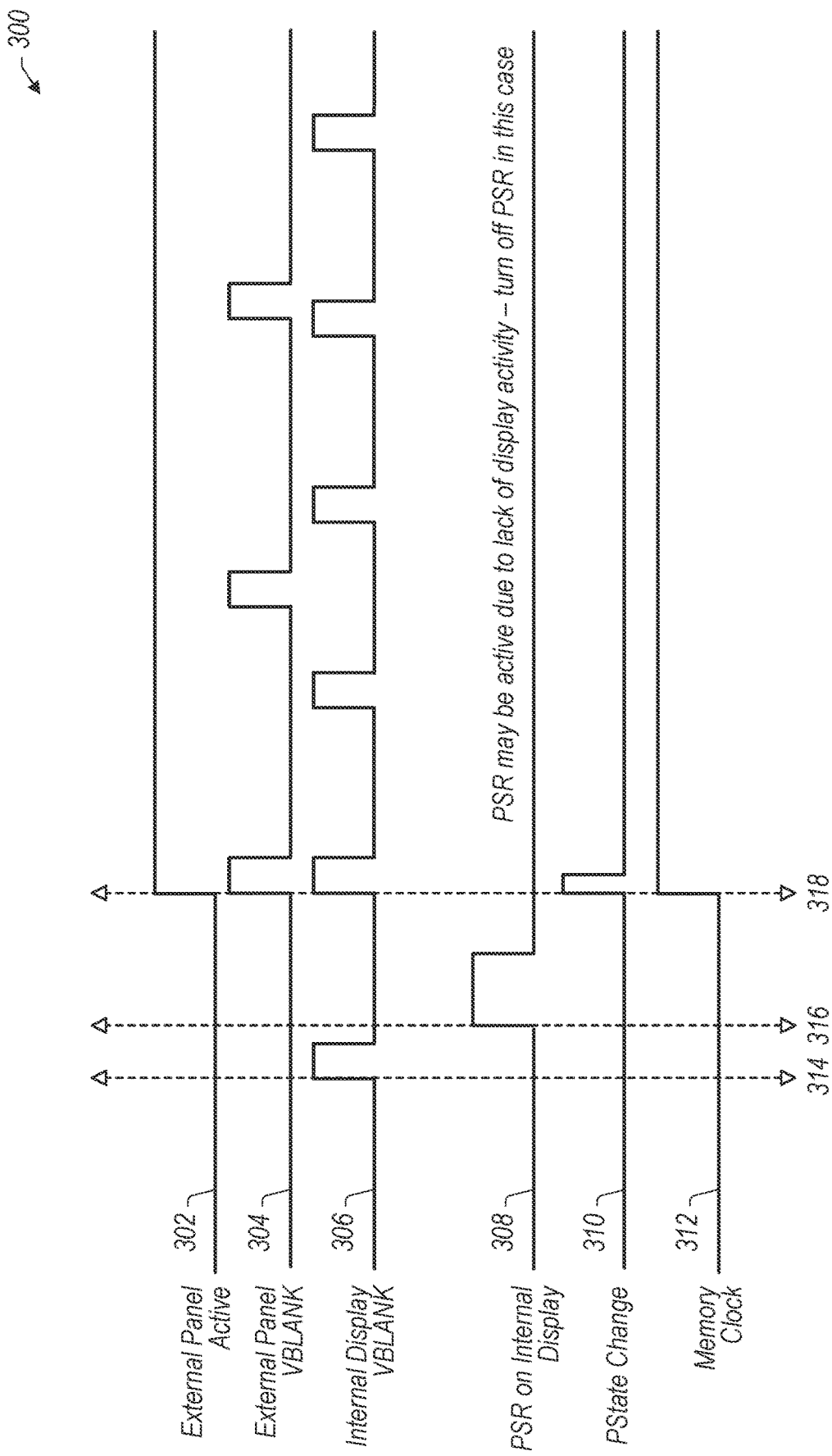
FIG. 3 is a timing diagram of one implementation of the timing of a memory clock frequency update for a multi-display system.

Referring now to FIG. 3, a timing diagram 300 of one implementation of the timing of a memory clock frequency update for a multi-display system is shown. Waveform 302 illustrates when the external display connection is actively established per some protocol like HDMI or DP. The external display may have already been physically connected some time earlier to the display connection becoming active. In the prior art, when an external display is connected to the system, the memory clock is typically set to its highest possible frequency. The reason behind this is that future adjustments to the frequency will not be feasible while the external display is connected, since finding a time when both the internal and external displays can be quiesced is difficult. However, using the techniques described in this disclosure, adjustments to the memory clock frequency while an external display is connected and actively displaying frames/images are possible.

Waveform 304 represents the vertical blanking (or VBLANK) interval timing for the external display. Each pulse shown in waveform 304 indicates when the vertical blanking interval is occurring. Waveform 306 shows the timing of the vertical blanking interval of the internal display. Waveform 308 represents when the internal display goes into panel self-refresh (PSR) mode. Waveform 310 represents when a power state (or PState) change takes place. Waveform 312 represents when a change to the memory clock takes place.

At the point in time denoted by dashed line 314, a vertical blanking interval occurs for the internal display. At the point in time represented by dashed line 316, the internal display goes into PSR mode. Then, at the point in time represented by dashed line 318, the external display is connected to the system. When the external display is connected to the system, the PSR mode is disabled (if it was already enabled) and the memory clock frequency is changed to its highest (or pre-determined) possible frequency since future memory clock frequency changes will be difficult to implement. In this example, the overlap of the vertical blanking intervals for the primary and external displays is a rare or infrequent occurrence and cannot be relied upon as a dependable way to change the memory clock frequency. However, keeping the memory clock at its maximum frequency results is inefficient in terms of power consumption. Accordingly, improved methods for making a memory clock frequency change are desired.

Figure 4:
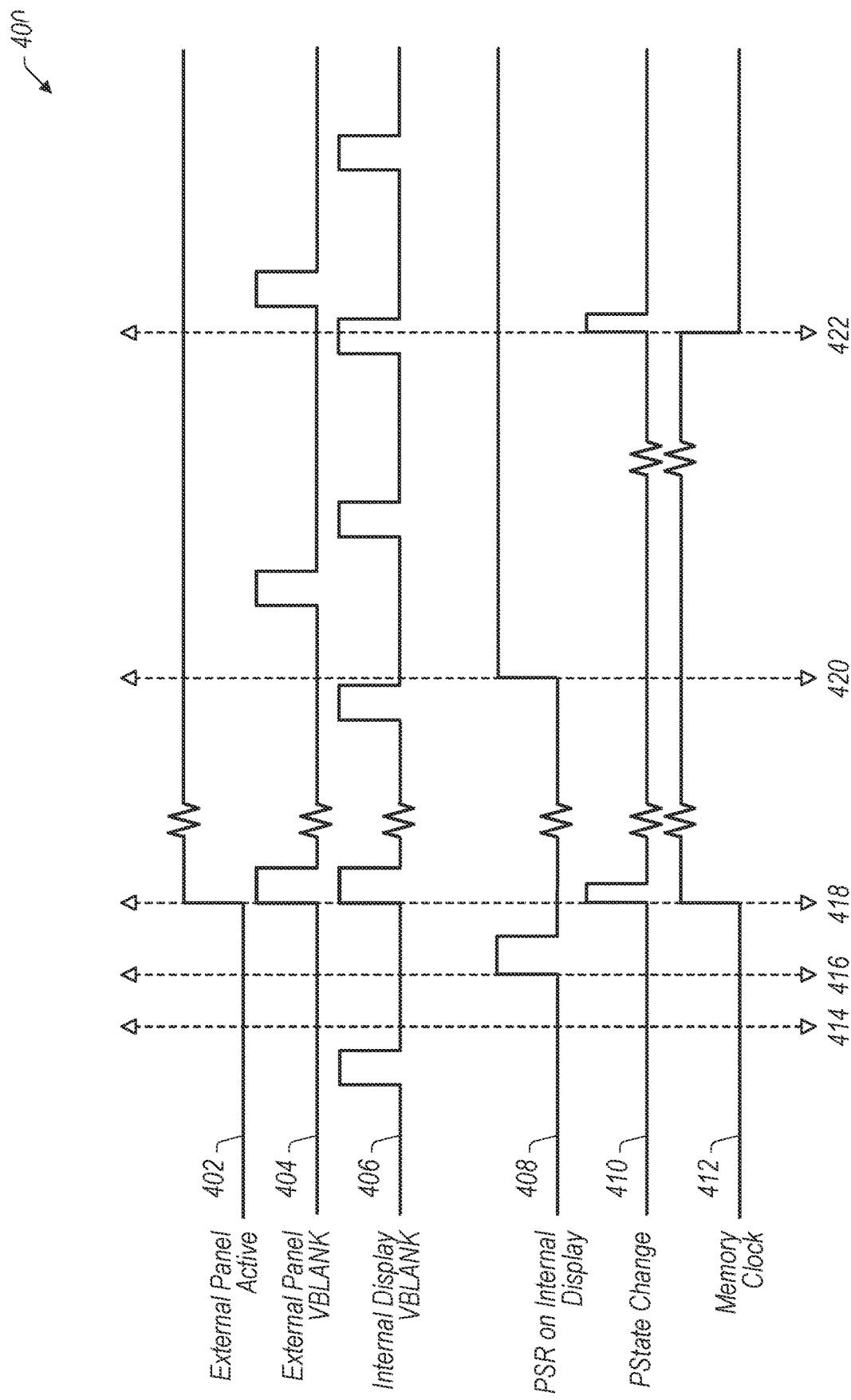
FIG. 4 is a timing diagram of a memory clock frequency update in a multi-display system in accordance with one implementation.

Turning now to FIG. 4, a timing diagram 400 of a memory clock frequency update in a multi-display system in accordance with one implementation is shown. Timing diagram 400 includes the same waveforms as are shown in timing diagram 300 (of FIG. 3). For example, waveform 402 represents the connection of the external display to the system, waveform 404 represents the timing of the vertical blanking interval for the external display, waveform 406 represents the timing of the vertical blanking interval for the internal display, waveform 408 represents when the internal display goes into PSR mode (or may already be in PSR mode), waveform 410 represents power-state changes, and waveform 412 represents when the memory clock frequency is adjusted.

At the point in time represented by dashed line 414, the vertical blanking interval for the internal display occurs. At the point in time represented by dashed line 416, the internal display goes into PSR mode. At the point in time represented by dashed line 418, a power-state change is implemented when the external display is connected to the system, bringing the memory clock frequency to its maximum value. This is similar to what occurred in the approach shown in FIG. 3.

At some point between in the interval between the point in time represented by dashed line 418 and a later point in time represented by dashed line 420, a decision is made to change the memory clock frequency. Once the decision to change the memory clock frequency is made, a signal is sent to the internal display for the internal display to transition into PSR mode (if the internal display is not already in PSR mode). This transition can take some amount of time to take place, in some cases multiple frames will elapse before the internal display enters PSR mode. Once the internal display enters PSR mode at dashed line 420, this allows a power-state change to occur at the point in time represented by dashed line 422 which coincides with when the external display has its vertical blanking interval. The power-state change is performed to reduce the memory clock frequency which results in a reduction of power consumption. The memory clock frequency could be at a low state or at a state somewhere in the middle between the highest frequency and the lowest frequency. After the power-state change is performed, the internal display could return to its previous PSR mode of on or off depending on what the internal display was in prior to the decision being made to change the memory clock frequency.

This technique of using the PSR mode to perform power-state changes makes it easier to choose times for performing power-state changes as compared to the prior technique of waiting for an overlap of vertical blanking intervals on both the internal and external displays. The choice to be in PSR mode for power savings, when the display is not being updated, is an independent decision—if PSR is used to facilitate memory/clock/mode changes, then once this action is complete, the PSR state should be restored.

Figure 5:
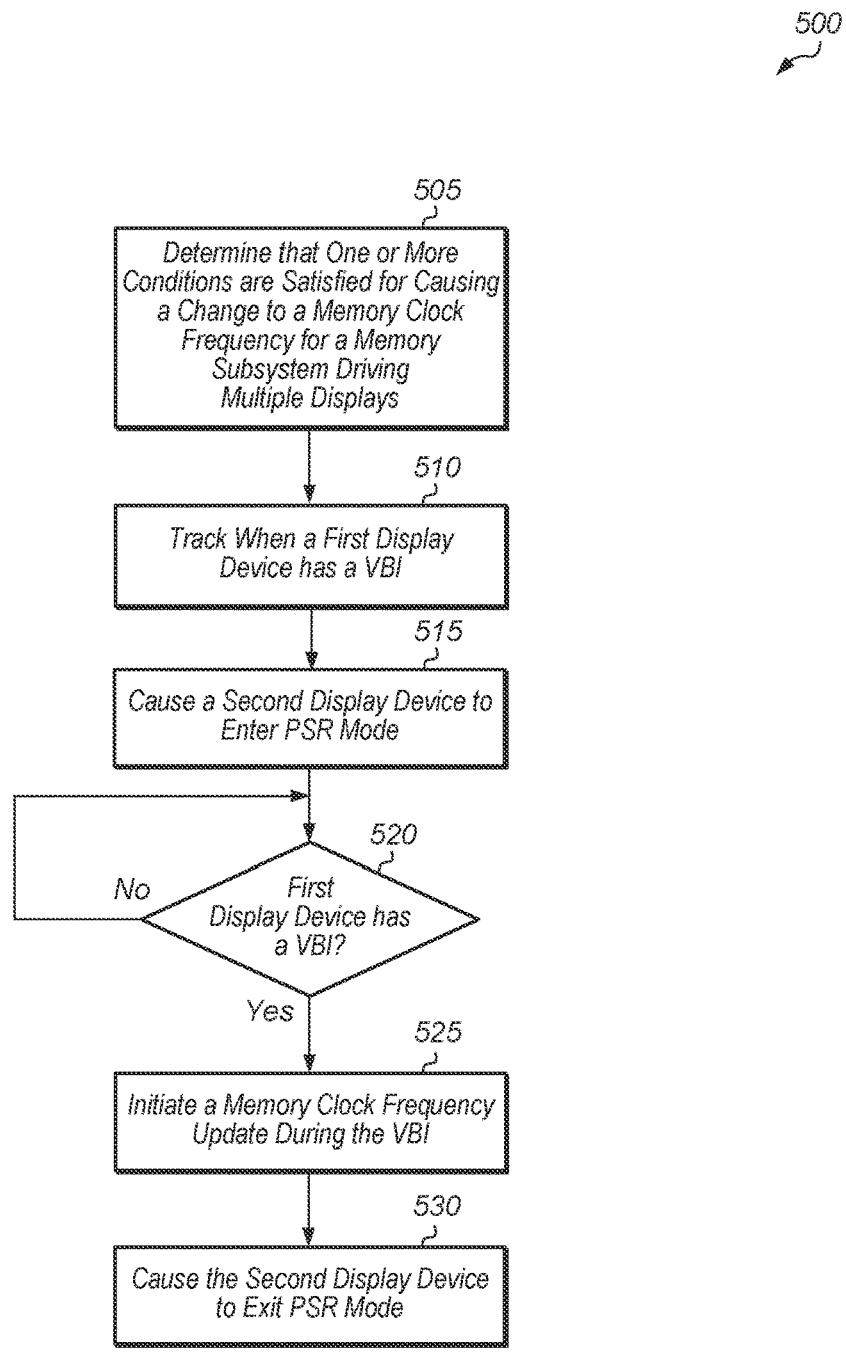
FIG. 5 is a generalized flow diagram illustrating one implementation of a method for performing memory clock frequency changes in a multi-display system.
Figure 6:
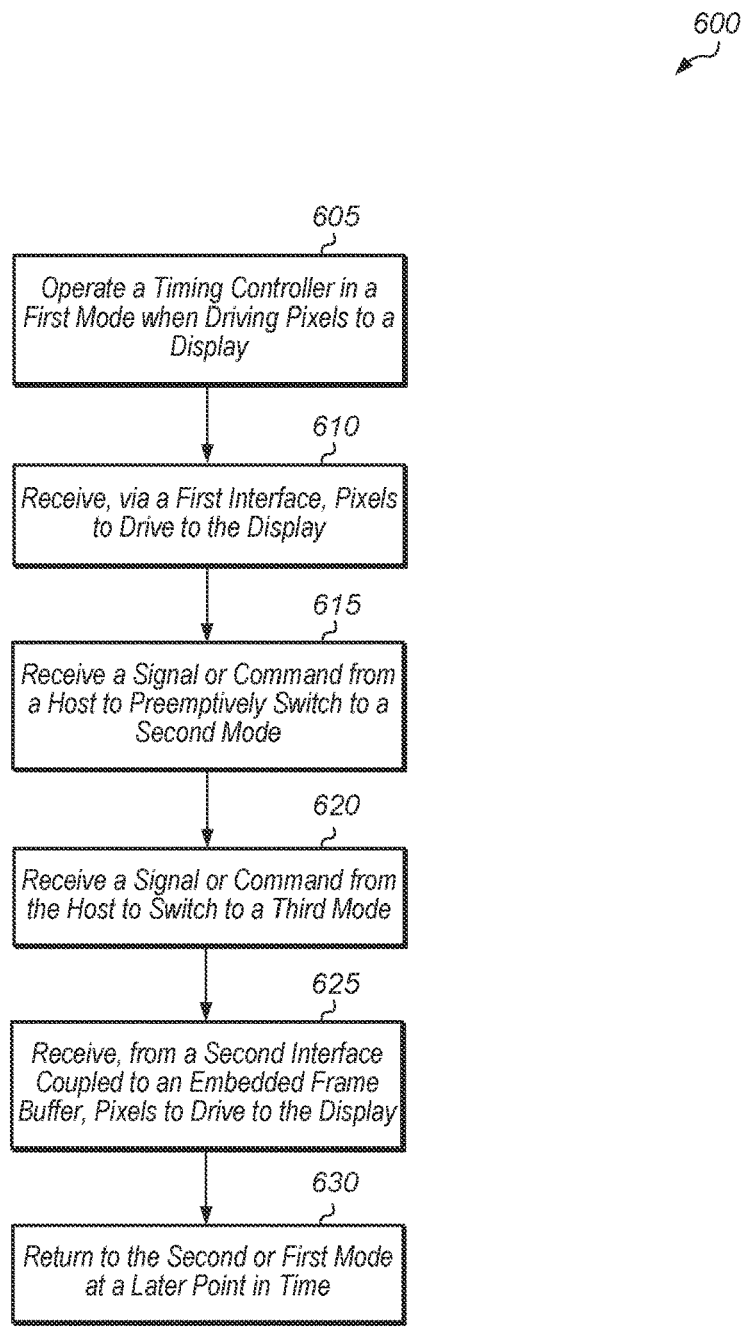
FIG. 6 is a generalized flow diagram illustrating one implementation of a method for operating a multi-mode timing controller.
Figure 7:
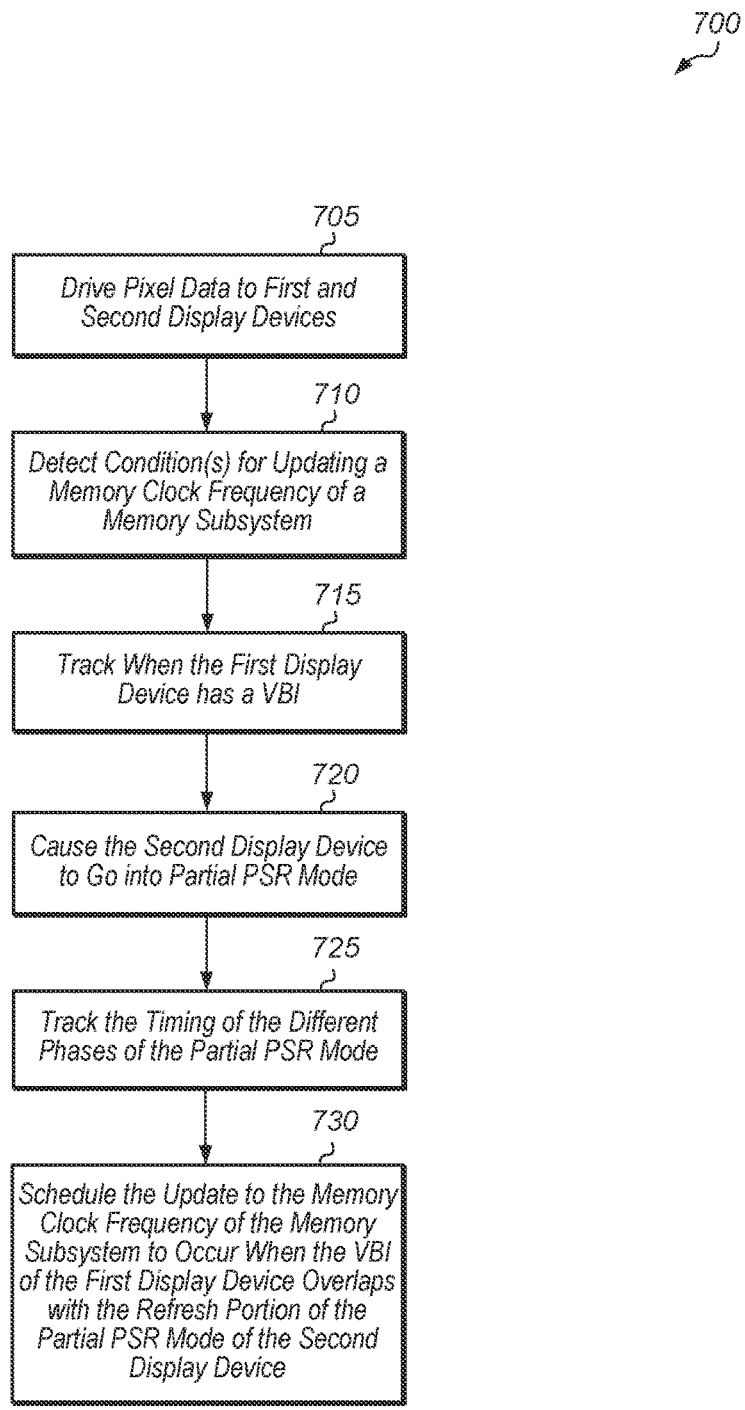
FIG. 7 is a generalized flow diagram illustrating one implementation of a method for performing a memory clock frequency update during a partial PSR mode.
Figure 8:
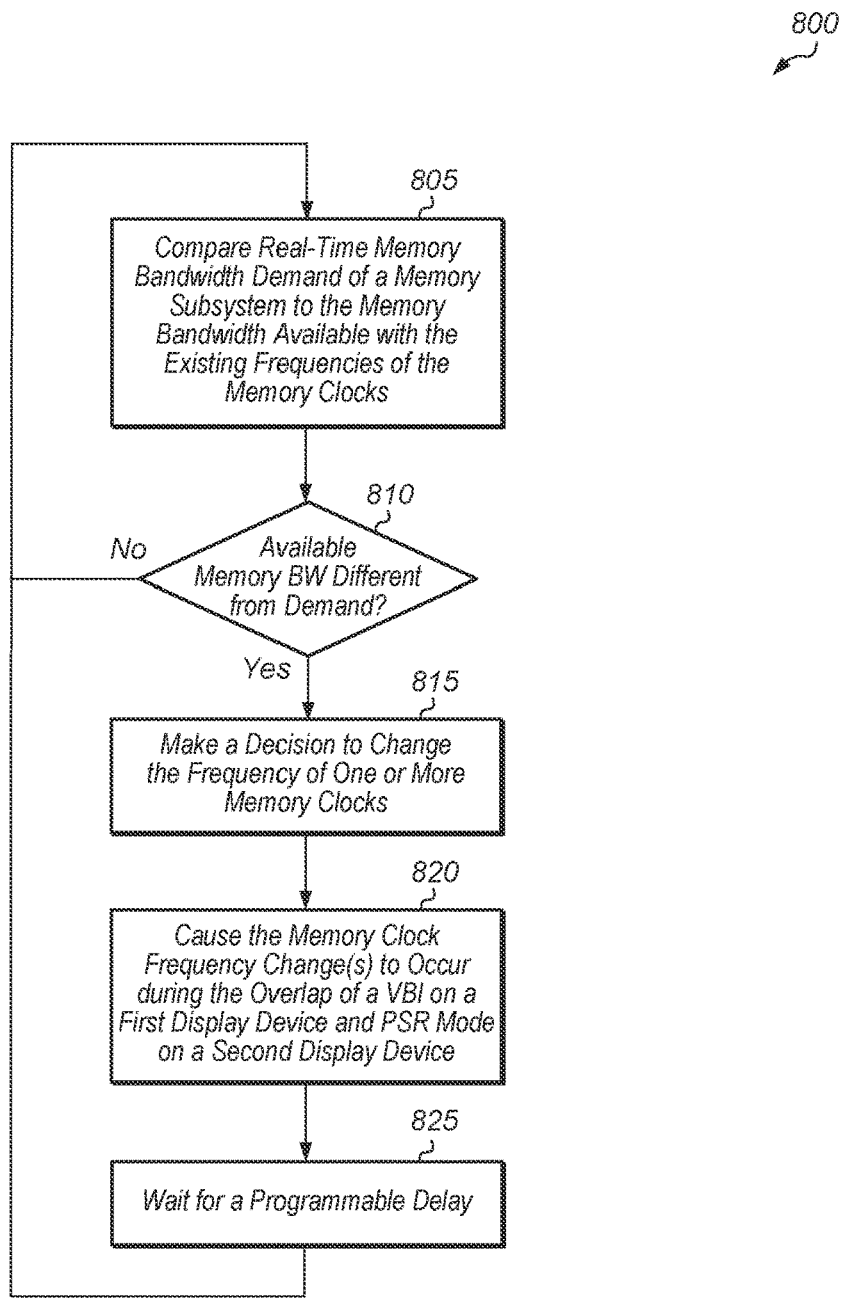
FIG. 8 is a generalized flow diagram illustrating one implementation of a method for determining when to change a memory clock frequency.

Referring now to FIG. 5, one implementation of a method 500 for performing memory clock frequency changes in a multi-display system is shown. For purposes of discussion, the steps in this implementation and those of FIG. 6-8 are shown in sequential order. However, it is noted that in various implementations of the described methods, one or more of the elements described are performed concurrently, in a different order than shown, or are omitted entirely. Other additional elements are also performed as desired. Any of the various systems or apparatuses described herein are configured to implement method 500.

A control unit determines that one or more conditions are satisfied for causing a change to a memory clock frequency for a memory subsystem driving multiple displays (block 505). In one implementation, the change to the memory clock frequency for the memory subsystem is performed as part of a power-state change. The one or more conditions that trigger the change to the memory clock frequency can vary from implementation to implementation. Method 800 describes one example of a condition for triggering a change to the memory clock frequency. Other conditions can cause a memory clock frequency change in other implementations. For example, in one implementation, connecting or disconnecting alternating current (AC) power or direct current (DC) power can cause a memory clock frequency change. There may be different allowable clock ranges depending on the power source. In another implementation, a change in the temperature of the host system or apparatus can trigger a desired to change the memory clock frequency. For example, if the temperature of the host system/apparatus exceeds a first threshold, then the control unit will attempt to reduce power consumption in order to lower the temperature. One of the ways for reducing the power consumption is by decreasing the memory clock frequency. In a further implementation, if the temperature falls below a second threshold, the control unit can increase the memory clock frequency since doing so will not cause the system/apparatus to overheat. In a still further implementation, if a performance increase is deemed to be desirable, then the control unit will attempt to increase performance by increasing the memory clock frequency. Other conditions for changing the memory clock frequency are possible and are contemplated.

In some implementations, the condition for triggering a change to the memory clock frequency can be event driven. The memory controller could post events when throughput used goes over/under some thresholds, instantaneously, over a window, or filtered temporally in some way. There can also be a software, firmware, or hardware-based mechanism that when a workload is submitted, the mechanism knows or predicts that the workload needs resources even before the workload is scheduled or executed. Similarly, when the workload finishes, the mechanism knows what resources are no longer needed. Also, a similar mechanism can account for periodic workloads. In another implementation, a real-time operating system (RTOS) may be aware of deadlines, and the RTOS can pick more optimal clocks depending on an approaching deadline.

Next, in response to detecting the condition(s) for causing a change to the memory clock frequency, the control unit tracks when a first display device has a vertical blanking interval (VBI) (block 510). Also, in response to detecting the condition(s) for causing a change to the memory clock frequency, the control unit causes a second display device to enter PSR mode (block 515). In some cases, entering PSR mode can involve two steps where PSR mode is enabled in a first step and then PSR mode is entered in a second step. This can depend, in at least one implementation, on the capabilities of the particular TCON of the second display device. If the second display device is already in PSR mode, then block 515 can be skipped. After the second display device enters PSR mode, if the first display device has a vertical blanking interval (conditional block 520, "yes" leg), then the control unit initiates a memory clock frequency update during the vertical blanking interval (block 525). In one implementation, as part of the memory clock frequency update, memory training is performed. After the memory clock frequency update is performed, the control unit causes the second display device to exit PSR mode (block 530). It is noted that the second display device can stay in PSR mode if other condition(s) for staying in PSR mode are detected. After block 530, method 500 ends. If the second display device is not in a vertical blanking interval (conditional block 520, "no" leg), then method 500 stays at conditional block 520. It is noted that method 500 can be repeated each time conditions(s) for changing the memory clock frequency are detected.

In various implementations, the first and second display devices described in method 500 have different refresh rates. For example, in one implementation, the first display device has a first refresh rate (e.g., 60 frames per second (fps)) and the second display device has a second refresh rate (e.g., 24 fps). It is assumed for the purposes of this discussion that the second refresh rate is different from the first refresh rate. In this implementation, the VBI's of the display devices will be occurring at different rates, and waiting for the VBI's to align is not a reliable strategy for allowing the memory clock frequency update to occur. This makes method 500 a useful technique for still allowing memory clock frequency updates to occur even when the display devices have different frame refresh rates.

Turning now to FIG. 6, one implementation of a method 600 for operating a multi-mode timing controller is shown. A timing controller operates in a first mode for driving pixels to a display (block 605). While operating in the first mode, the timing controller receives, via a first interface, pixels to drive to a display (block 610). In one implementation, the first interface is an eDP interface. In other implementations, the first interface can be any of various other types of interfaces.

Then, at a later point in time, the timing controller receives a signal or command from a host (e.g., processor) to preemptively switch to a second mode (block 615). The signal or command can be communicated on the first interface or using a sideband signal, depending on the implementation. In one implementation, the second mode is a pre-PSR mode which allows for a relatively fast transition into PSR mode. For example, in this implementation, while it may take 4 or 5 cycles to switch from the first mode into PSR mode, it may only take 1 or 2 cycles to switch from pre-PSR mode into PSR mode.

Next, the timing controller receives a signal or command from the host to switch to a third mode (block 620). In one implementation, the third mode is PSR mode. In one scenario, the signal or command specifies a number of frames during which the timing controller is to operate in the third mode. While operating in the third mode, the timing controller receives, from a second interface coupled to an embedded frame buffer, pixels to drive to the display (block 625). In one implementation, the timing controller drives pixels to the display from the embedded frame buffer for a specified number of frames. In another implementation, the timing controller drives pixels to the display from the embedded frame buffer until receiving a signal or command from the host to exit the third mode. In either case, the timing controller returns to the second or first mode at a later point in time (block 630). Whether the timing controller returns to the second or first mode from the third mode can depend on a variety of factors, including a specific command from the host, a programmable setting, the status of one or more operating conditions, or otherwise. After block 630, method 600 ends.

Referring now to FIG. 7, one implementation of a method 700 for performing a memory clock frequency update during a partial PSR mode is shown. A system drives pixel data to first and second display devices (block 705). While driving the pixel data to the first and second display devices, a control unit detects one or more conditions for updating a memory clock frequency of a memory subsystem (block 710). The condition(s) that are detected can vary from implementation to implementation.

In response to detecting the condition(s) for updating the memory clock frequency of the memory subsystem, the control unit tracks when the first display device has a VBI (block 715). Also in response to detecting the condition(s) for updating the memory clock frequency of the memory subsystem, the control unit causes the second display device to go into partial PSR mode (block 720). Partial PSR mode refers to a mode when only a portion of the screen will be redrawn while the remaining portions will be refreshed (i.e., repeated) from a previous frame. For example, when a user moves a mouse to a new part of the screen, but the other screen contents remain the same, partial PSR mode can be implemented to reuse most of the previous frame while only updating the portions of the frame affected by movement of the mouse. Partial PSR mode can also be used in other scenarios where only a portion of the screen is being updated. It is noted that partial PSR mode is also sometimes referred to as "Selective Update PSR".

Next, the control unit tracks the timing of the different phases of the partial PSR mode (block 725). Then, the control unit schedules the update to the memory clock frequency of the memory subsystem to occur when the VBI of the first display device overlaps (i.e., aligns) with the refresh portion of the partial PSR mode of the second display device (block 730). After block 730, method 700 ends.

Turning now to FIG. 8, one implementation of a method 800 for determining when to change a memory clock frequency is shown. A memory bandwidth monitor (e.g., memory bandwidth monitor 212 of FIG. 2) compares real-time memory bandwidth demand of a memory subsystem to the memory bandwidth available with the existing frequencies of the memory clocks (block 805). The comparison can take place instantaneously or multiple times over a fixed or adaptive time duration. The real-time memory bandwidth demand depends on the control algorithm and can include current, recent peak, rolling average, filtered, or other variations. In one implementation, the real-time memory bandwidth demand includes predicted demand if a workload has been requested or scheduled to happen but has not yet begun. In another implementation, the real-time memory bandwidth demand includes trending demand.

If the memory bandwidth (BW) available with the existing frequencies of the memory clocks is different from the real-time memory bandwidth demand by more than a threshold (conditional block 810, "yes" leg), then a control unit (e.g., control unit 210) makes a decision to change the frequency of one or more memory clocks (block 815). In one implementation, each memory clock has separate control parameters (e.g., a separate threshold). In various implementations, the threshold can include components of temporal filter, hysteresis, and so on. In one implementation, if the available memory bandwidth is more than the demand there can be a condition, heuristic or mathematical, that can delay changing the frequency. If the available memory bandwidth is less than the demand, then the control unit may want to increase the frequency as quickly as possible. Accordingly, the condition in conditional block 810 can be programmable and include time, filtering, and so on.

Next, a tracking unit (e.g., tracking unit 213) and a frequency adjustment unit (e.g., frequency adjustment unit 214) causes the memory clock frequency change(s) to occur on the overlap of a VBI on a first display device and PSR mode on a second display device (block 820). After a programmable delay (block 825), method 800 returns to block 805. The programmable delay in block 825 prevents memory clock frequency change hysteresis. Otherwise, if the memory bandwidth available with the existing frequencies of the memory clocks is within a threshold of the real-time memory bandwidth demand (conditional block 810, "no" leg), then method 800 returns to block 805.

In various implementations, program instructions of a software application are used to implement the methods and/or mechanisms described herein. For example, program instructions executable by a general or special purpose processor are contemplated. In various implementations, such program instructions are represented by a high level programming language. In other implementations, the program instructions are compiled from a high level programming language to a binary, intermediate, or other form. Alternatively, program instructions are written that describe the behavior or design of hardware. Such program instructions are represented by a high-level programming language, such as C. Alternatively, a hardware design language (HDL) such as Verilog is used. In various implementations, the program instructions are stored on any of a variety of non-transitory computer readable storage mediums. The storage medium is accessible by a computing system during use to provide the program instructions to the computing system for program execution. Generally speaking, such a computing system includes at least one or more memories and one or more processors configured to execute program instructions.

It should be emphasized that the above-described implementations are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. An apparatus comprising:
a tracking circuitry, wherein responsive to determining that a condition for changing a memory clock frequency of a memory subsystem is satisfied, the tracking circuitry is configured to:
track vertical blanking interval (VBI) timing for a first display device to detect an occurrence of a VBI of the first display device; and
cause a second display device, different from the first display device, to transition into panel self-refresh (PSR) mode; and
a frequency adjustment circuitry configured to cause an adjustment to be made to the memory clock frequency when the VBI of the first display device is detected to occur at a same time that the second display device is in the PSR mode.

2. The apparatus as recited in claim 1, wherein the adjustment causes the memory clock frequency to change from a first frequency to a second frequency different from the first frequency.

3. The apparatus as recited in claim 1, wherein the condition for changing the memory clock frequency comprises memory bandwidth demand differing by more than a threshold from memory bandwidth available with the memory clock frequency.

4. The apparatus as recited in claim 1, wherein the tracking circuitry is further configured to cause the second display device to exit PSR mode subsequent to the adjustment being made to the memory clock frequency.

5. The apparatus as recited in claim 1, wherein the apparatus is further configured to:
cause the second display device to go into partial PSR mode; and
schedule the adjustment to the memory clock frequency to occur when a refresh portion of the partial PSR mode of the second display device overlaps with the VBI of the first display device.

6. The apparatus as recited in claim 1, wherein the apparatus is further configured to cause memory training to be performed while the second display device is in PSR mode simultaneously with the VBI occurring for the first display device.

7. The apparatus as recited in claim 1, wherein the frequency adjustment circuitry is further configured to send, to a phase-locked loop, a command to cause the adjustment to be made to the memory clock frequency when the PSR mode of the second display overlaps with the VBI of the first display device.

8. A method comprising:
tracking, by a control circuitry, vertical blanking interval (VBI) timing for a first display device to detect an occurrence of a VBI of the first display device, responsive to determining that a condition for changing a memory clock frequency of a memory subsystem is satisfied;
causing a second display device, different from the first display device, to transition into panel self-refresh (PSR) mode; and
causing an adjustment to be made to the memory clock frequency responsive to detecting the VBI of the first display device occurs at a same time that the second display device is in the PSR mode.

9. The method as recited in claim 8, wherein the adjustment causes the memory clock frequency to change from a first frequency to a second frequency different from the first frequency.

10. The method as recited in claim 8, wherein the condition for changing the memory clock frequency comprises real-time memory bandwidth demand differing by more than a threshold from memory bandwidth available with the memory clock frequency.

11. The method as recited in claim 8, further comprising causing the second display device to exit PSR mode subsequent to the adjustment being made to the memory clock frequency.

12. The method as recited in claim 8, further comprising:
causing the second display device to go into partial PSR mode; and
scheduling the adjustment to the memory clock frequency to occur when a refresh portion of the partial PSR mode of the second display device overlaps with the VBI of the first display device.

13. The method as recited in claim 8, further comprising causing memory training to be performed while the second display device is in PSR mode simultaneously with the VBI occurring for the first display device.

14. The method as recited in claim 8, further comprising sending, to a phase-locked loop, a command to cause the adjustment to be made to the memory clock frequency responsive to determining that the PSR mode of the second display device overlaps with the VBI of the first display device.

15. A system comprising:
 a timing controller configured to drive pixel data to a first display device; and
 a control circuitry, wherein responsive to determining that a condition for changing a memory clock frequency of a memory subsystem is satisfied, the control circuitry is configured to:
  cause the timing controller to transition into panel self-refresh (PSR) mode;
  track vertical blanking interval (VBI) timing for a second display device different from the first display device, to detect an occurrence of a VBI of the first display device; and
  cause an adjustment to be made to the memory clock frequency responsive to detecting the first VBI of the first display device occurs at a same time that the second display device is in the PSR mode.

16. The system as recited in claim 15, wherein the adjustment causes the memory clock frequency to change from a first frequency to a second frequency different from the first frequency.

17. The system as recited in claim 15, wherein the condition for changing the memory clock frequency comprises real-time memory bandwidth demand differing by more than a threshold from memory bandwidth available with the memory clock frequency.

18. The system as recited in claim 15, wherein the control circuitry is further configured to cause the timing controller to exit PSR mode subsequent to the adjustment being made to the memory clock frequency.

19. The system as recited in claim 15, wherein the control circuitry is further configured to:
 cause the timing controller to go into partial PSR mode; and
 schedule the adjustment to the memory clock frequency to occur when a refresh portion of the partial PSR mode of the timing controller overlaps with the VBI of the second display device.

20. The system as recited in claim 15, wherein the control circuitry is further configured to cause memory training to be performed while the timing controller is in PSR mode simultaneously with the VBI occurring for the second display device.

* * * * *